United States Patent
Chang et al.

(10) Patent No.: US 8,194,457 B2
(45) Date of Patent: Jun. 5, 2012

(54) SOFT PROGRAM METHOD AND COMPUTER READABLE MEDIUM THEREOF

(75) Inventors: Chin-Hung Chang, Tainan (TW); Su-Chueh Lo, Hsinchu (TW); Chen-Chia Fan, Zhubei (TW); Chia-Feng Cheng, Changhua (TW)

(73) Assignee: Macronix International Co., Ltd., Hsinchu (TW)

( * ) Notice: Subject to any disclaimer, the term of this patent is extended or adjusted under 35 U.S.C. 154(b) by 133 days.

(21) Appl. No.: 12/868,870

(22) Filed: Aug. 26, 2010

(65) Prior Publication Data

US 2012/0051142 A1    Mar. 1, 2012

(51) Int. Cl.
*G11C 11/34* (2006.01)
*G11C 16/04* (2006.01)
*G11C 16/06* (2006.01)

(52) U.S. Cl. ........... 365/185.18; 365/185.22; 365/185.3; 365/185.33

(58) Field of Classification Search ............. 365/185.18, 365/185.22, 185.29, 185.3, 185.33
See application file for complete search history.

(56) References Cited

U.S. PATENT DOCUMENTS 7,974,130 B2 * 7/2011 Nakamura et al. .......... 365/185.2
2009/0122617 A1 * 5/2009 Noh ......................... 365/185.24

* cited by examiner

*Primary Examiner* — Ly D Pham
(74) *Attorney, Agent, or Firm* — Thomas|Kayden

(57) ABSTRACT

A soft program method is provided for recovering memory cells of a memory array. In an embodiment, the method includes the following steps. Memory blocks of the memory array are soft programmed with first bias voltage. A selected memory unit within a selected memory block is then soft programmed with second bias voltage. Next, whether a judging criterion is met is determined. If not, the method is repeated from the step of soft programming with the second bias voltage; if so, whether the selected unit is a last memory unit is determined. If the selected unit is not the last memory unit, other memory unit is assigned as the selected memory unit and the method is repeated from the step of soft programming with the second bias voltage. When the selected unit is the last memory unit, the memory array is bit-by-bit soft programmed with a third bias voltage.

17 Claims, 14 Drawing Sheets

SOFT PROGRAM METHOD AND COMPUTER READABLE MEDIUM THEREOF

BACKGROUND OF THE INVENTION

1. Field of the Invention

The invention relates in general to a soft program method, and more particularly to a soft program method with reduced bit-by-bit soft program time.

2. Description of the Related Art

In the present age, non-volatile memory devices have become more popular for use in various electronic devices, such as cellular telephones, digital cameras, personal digital assistants, mobile computing devices, non-mobile computing devices and so on. For example, flash memory is one of the most popular non-volatile semiconductor memories applied in the present age. Generally, flash memory includes flash memory cells with programmable threshold voltages, so that each of the flash memory cells can be selectively programmed to indicate logic datum "1" and indicating logic datum "0".

Conventionally, flash memory often suffers over-erase issue due to the process inconsistencies. In the present skill, soft program method has been introduced for recovering bits suffering over-erase issue. However, how to find a decent soft program method capable of reducing time and cost required by soft program operation has become a prominent object for the industries.

SUMMARY OF THE INVENTION

The invention is directed to a soft program method applied in flash memory for recovering memory cells, which are over erased in an erase operation, of the flash array. In an embodiment, the soft program method applies soft program operations in block-by-block scale (i.e. soft program operation by column), in unit-by-unit (with size smaller than memory block) scale, and in bit-by-bit scale. In some embodiments, the soft program method can further be implemented by a number of different smart soft program processes for realizing soft program in realizing soft program operation in bit-by-bit scale. Thus, in comparison to the conventional soft program method, the soft program method is advantageously capable of reducing time and cost required by soft program operation.

According to a first aspect of the present invention, a soft program method is provided for recovering memory cells, which are over erased in an erase operation, of a memory array including a plurality of memory blocks. The method includes the following steps. Firstly performing step (A), the memory blocks are soft programmed with a first bias voltage, wherein each of the memory blocks can be segmented into a plurality of memory units. Next performing step (B1), a selected memory unit within a selected memory block is soft programmed with a second bias voltage. Then performing step (B2) whether a judging criterion corresponding to the selected memory unit is met is determined; if not, the method is repeated from step (B1); if so, step (B3) is performed to determine whether the selected unit is a last memory unit among the selected memory block. When the selected unit is not the last memory unit, step (B4) is performed to assign other memory unit as the selected memory unit and the method is repeated from step (B1). When the selected unit is the last memory unit, step (C) is performed to bit-by-bit soft program the memory array with a third bias voltage.

According to a second aspect of the present invention, a computer readable medium for executing a soft program method for recovering memory cells, which are over erased in an erase operation, of a memory array is provided, wherein the memory array comprising a plurality of memory blocks. The method includes the following steps. Firstly performing step (A), the memory blocks are soft programmed with a first bias voltage, wherein each of the memory blocks can be segmented into a plurality of memory units. Next performing step (B1), a selected memory unit within a selected memory block is soft programmed with a second bias voltage. Then performing step (B2) whether a judging criterion corresponding to the selected memory unit is met is determined; if not, the method is repeated from step (B1); if so, step (B3) is performed to determine whether the selected unit is a last memory unit among the selected memory block. When the selected unit is not the last memory unit, step (B4) is performed to assign other memory unit as the selected memory unit and the method is repeated from step (B1). When the selected unit is the last memory unit, step (C) is performed to bit-by-bit soft program the memory array with a third bias voltage.

The invention will become apparent from the following detailed description of the preferred but non-limiting embodiments. The following description is made with reference to the accompanying drawings.

DETAILED DESCRIPTION OF THE INVENTION

The soft program method according to an embodiment of the invention sequentially applies a soft program operation in block-by-block scale, in unit-by-unit (with size smaller than memory block) scale, and in bit-by-bit scale.

Figure 1:
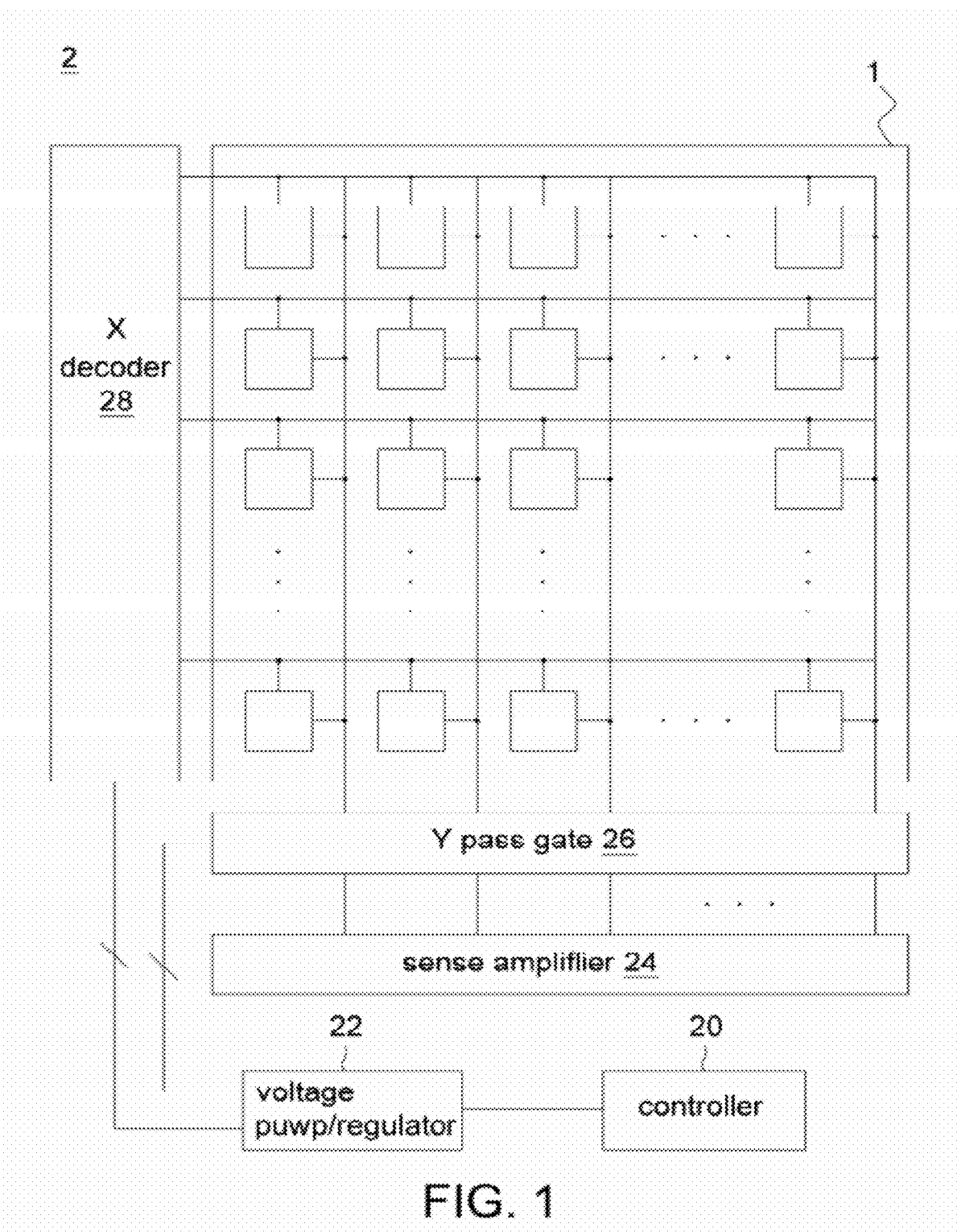
FIG. 1 shows a block diagram of the memory applying the soft program method of an embodiment of the invention.

The soft program method of the present embodiment of the invention is executed by a controller included in a memory 2, as shown in FIG. 1. The memory 2 includes the controller 20, a voltage pump/regulator 22, a sense amplifier 24, a Y pass gate 26, an X decoder 28, and a memory array 1. For example, the soft program method is executed after erase operations, including an erase protect check operation, a pre-program operation, an erase operation, and an erase verify operation for example, have been applied on the memory array 1.

In an example, the memory array 1 includes a number of memory blocks, each of which includes memory cells accessed by a respective bit line. In other words, each of the memory blocks includes a column of memory cells. Each of the memory blocks can be further segmented into a number of memory units, each of which includes memory cells accessed by a number of word lines. For example, each of the memory units within a specific memory block includes memory cells accessed by 4 word lines.

Figure 2:
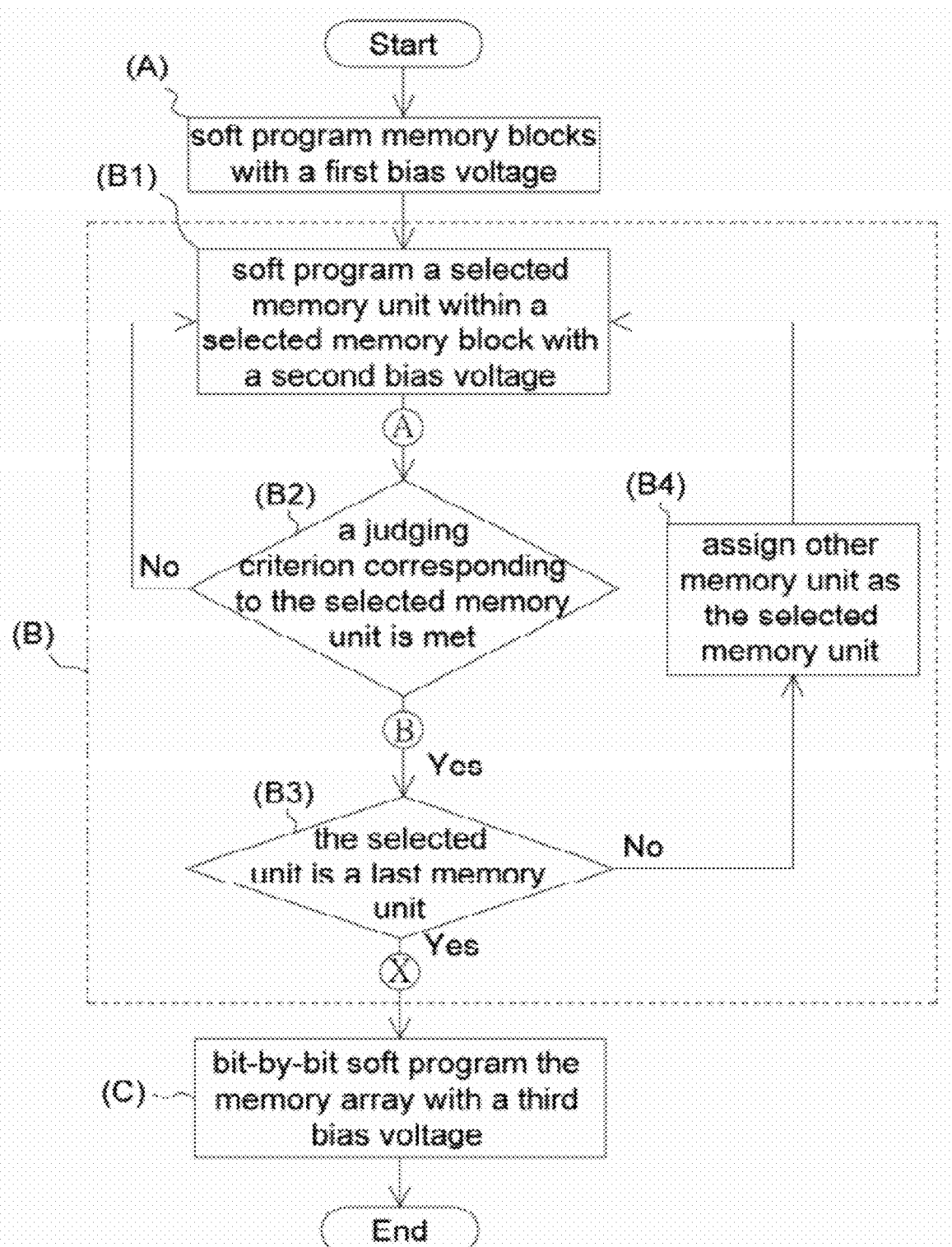
FIG. 2 shows a flow chart of the soft program method according to the embodiment of the invention.

Referring to FIG. 2, a flow chart of the soft program method according to the present embodiment of the invention. The soft program method includes the following steps. Firstly, step (A) is performed by soft programming each of the memory blocks with a first bias voltage. Next, step (B) is performed, so as to carry out soft program operation in unit-by-unit on memory units within a selected memory block. In an example, step (B) includes sub-steps (B1)-(B4).

Firstly, step (B1) is performed, so that a selected memory unit within a selected memory block is soft programmed with a second bias voltage. For example, the second bias voltage has a level higher than the first bias voltage for providing stronger soft program operation. Next, step (B2) is performed, so that it is determined that whether a judging criterion corresponding to the selected memory unit is met.

Figure 3:
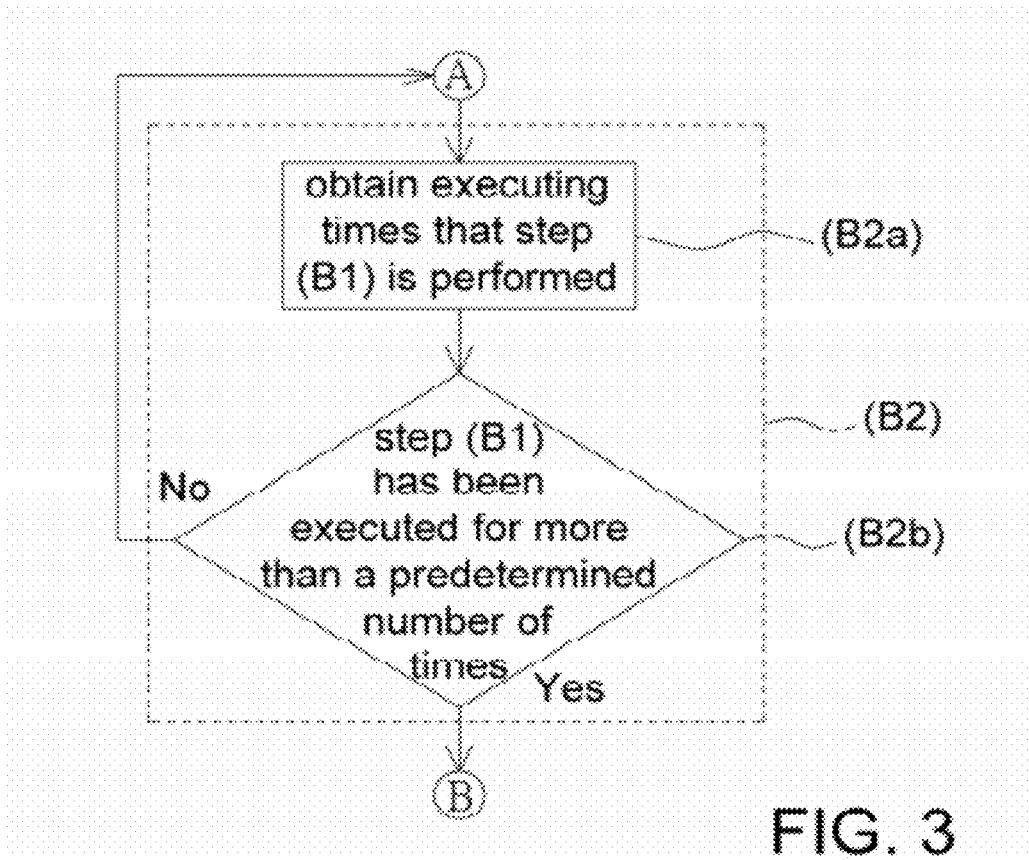
FIG. 3 shows a detailed flow chart of an example of step (B2) shown in FIG. 2.

In an example, the judging criterion is related to the executing times of the step (B1) and step (B2) further includes sub-steps (B2a) and (B2b), as shown in FIG. 3. In step (B2a) and (B2b), operation of obtaining the executing times that step (B1) and operation of determining whether step (B1) has been executed for more than a predetermined number of times are respectively executed. When step (B1) has been executed for more than the predetermined number of times, it is determined that the judging criterion is met. When step (B1) has not been executed for more than the predetermined number of times, it is determined that the judging criterion is not met.

Figure 4:
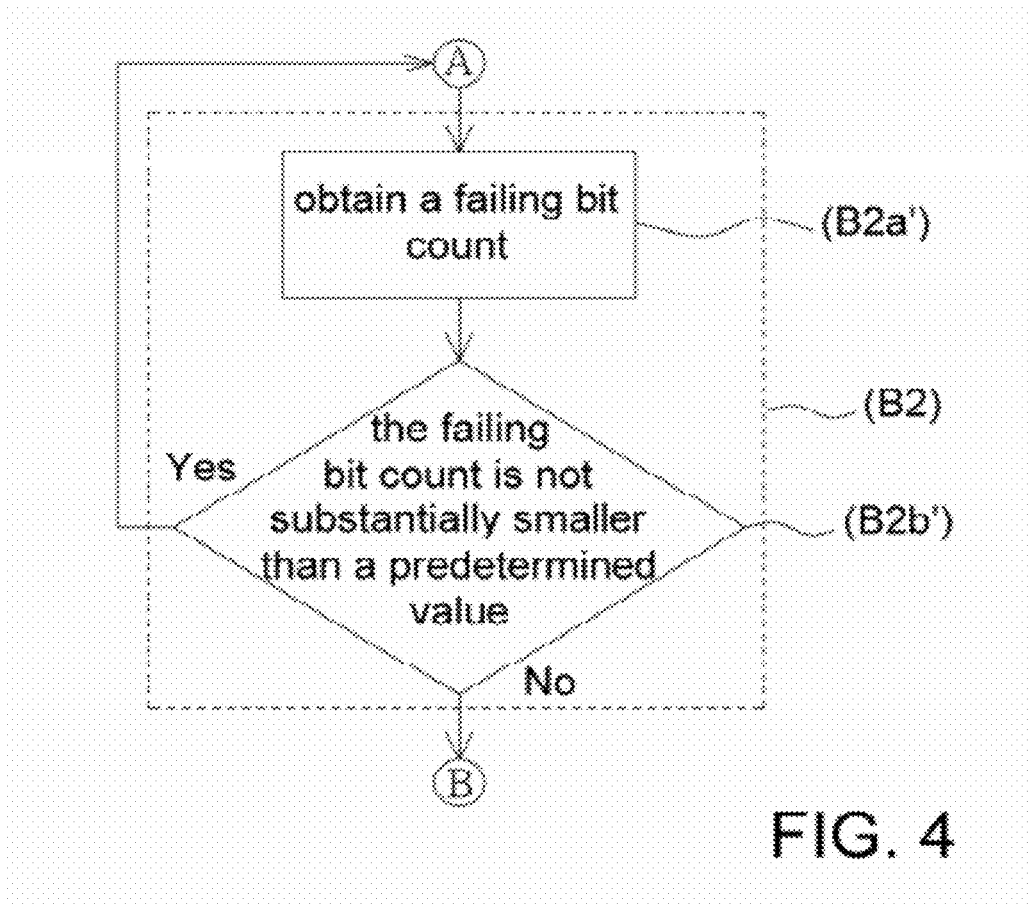
FIG. 4 shows a detailed flow chart of another example of step (B2) shown in FIG. 2.

In other example, the judging criterion is related to the failing bit count indicating the number of bits that are over erased within the selected memory unit and step (B2) includes sub-steps (B2a') and (B2b'), as shown in FIG. 4. In step (B2a') and (B2b'), operation of obtaining the failing bit count of the selected memory unit and operation of determining whether the failing bit count of the selected memory unit is substantially smaller than a predetermined value are respectively executed. For example, a soft program verification is included in step (B1) and the predetermined value is a previously obtained failing bit count obtained in that soft program verification in step (B1). With this example, if the failing bit count step (B1) is not smaller than the predetermined the value, it is determined that the judging criterion is met. When the failing bit count in step (B1) is smaller than the predetermined value, it is determined that the judging criterion is not met.

In step (B2), if the judging criterion is not met, step (B1) is repeated until it is met. If the judging criterion is met, the method proceeds to step (B3). In step (B3), whether the selected unit is a last memory unit within the selected memory block is determined. If not, step (B4) is performed to assign other memory unit as the selected memory unit and the method is repeated from step (B1). Accordingly, the variable used in the judging criterion, for example, the executing times of step (B1), or the failing bit count obtained in step (B2a) or (B2a'), is reset in step (B4).

When the selected unit is the last memory unit within the selected memory block, the method proceeds to step (C), in which bit-by-bit soft program operation is performed on the memory array 1 with a third bias voltage. For example, the third bias voltage has a level higher than the second bias voltage for providing stronger soft program operation.

In the following paragraphs, examples will be made to illustrate the detailed bit-by-bit soft program operation recited in step (C). In an example, two bit-by-bit soft program operation modes with different soft program basic operation units, e.g. the bit-by-bit soft program in word mode and the bit-by-bit soft program in page mode, are employed in step (C). For example, the memory array 1 can be segmented into a number of words, each of which includes 16 bits of memory cells accessed by a same word line and a number of words, e.g. 128 words, form a page. A word is a designated unit for soft program operation in the bit-by-bit soft program in word mode, while a page is a designated unit for soft program in the bit-by-bit soft program in page mode.

Figure 5A:
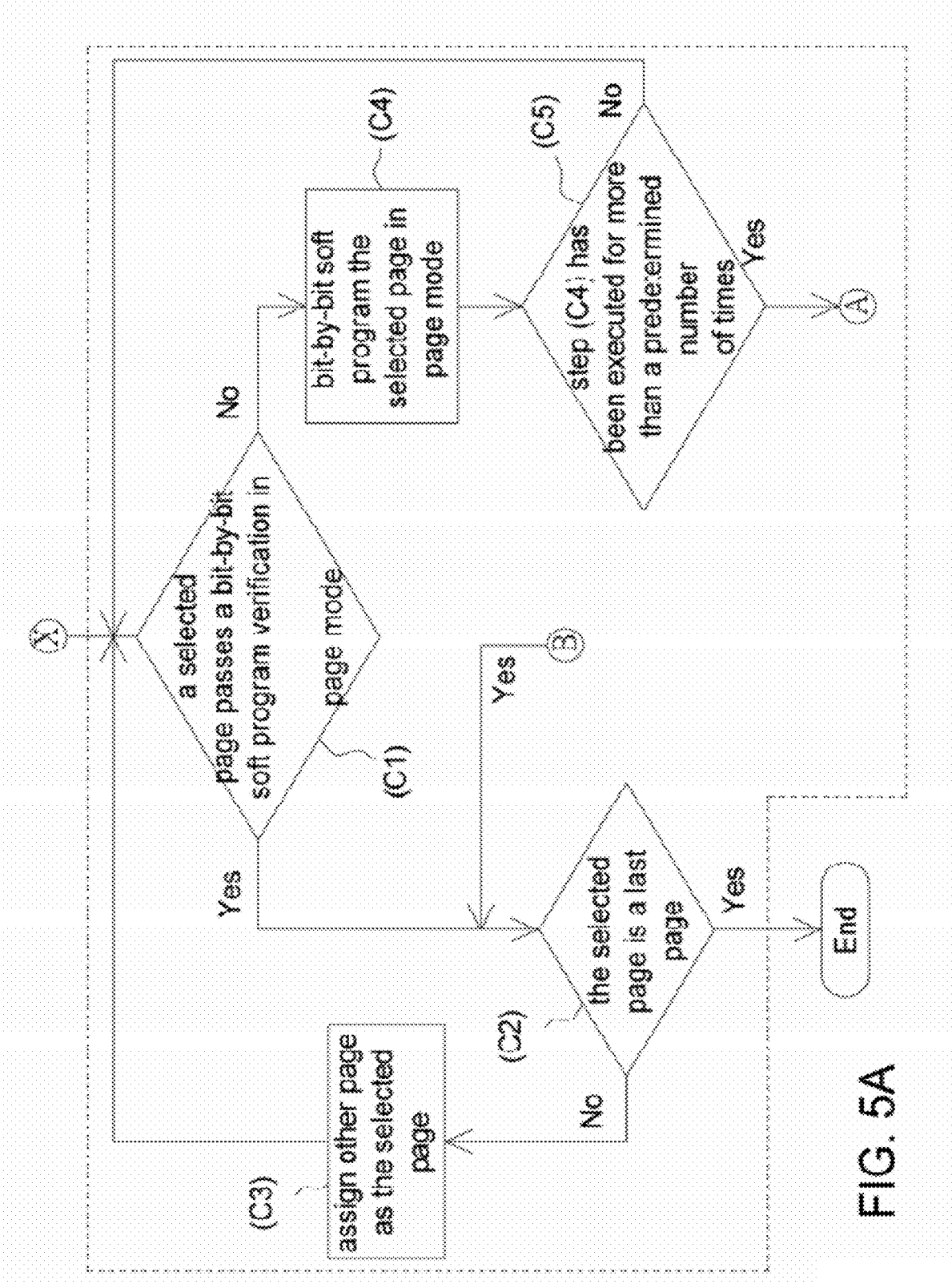
FIGS. 5A-5B, 6A-6C, 7A-7B, 8A-8C show detailed flow charts of another example of step (C) shown in FIG. 2.
Figure 5B:
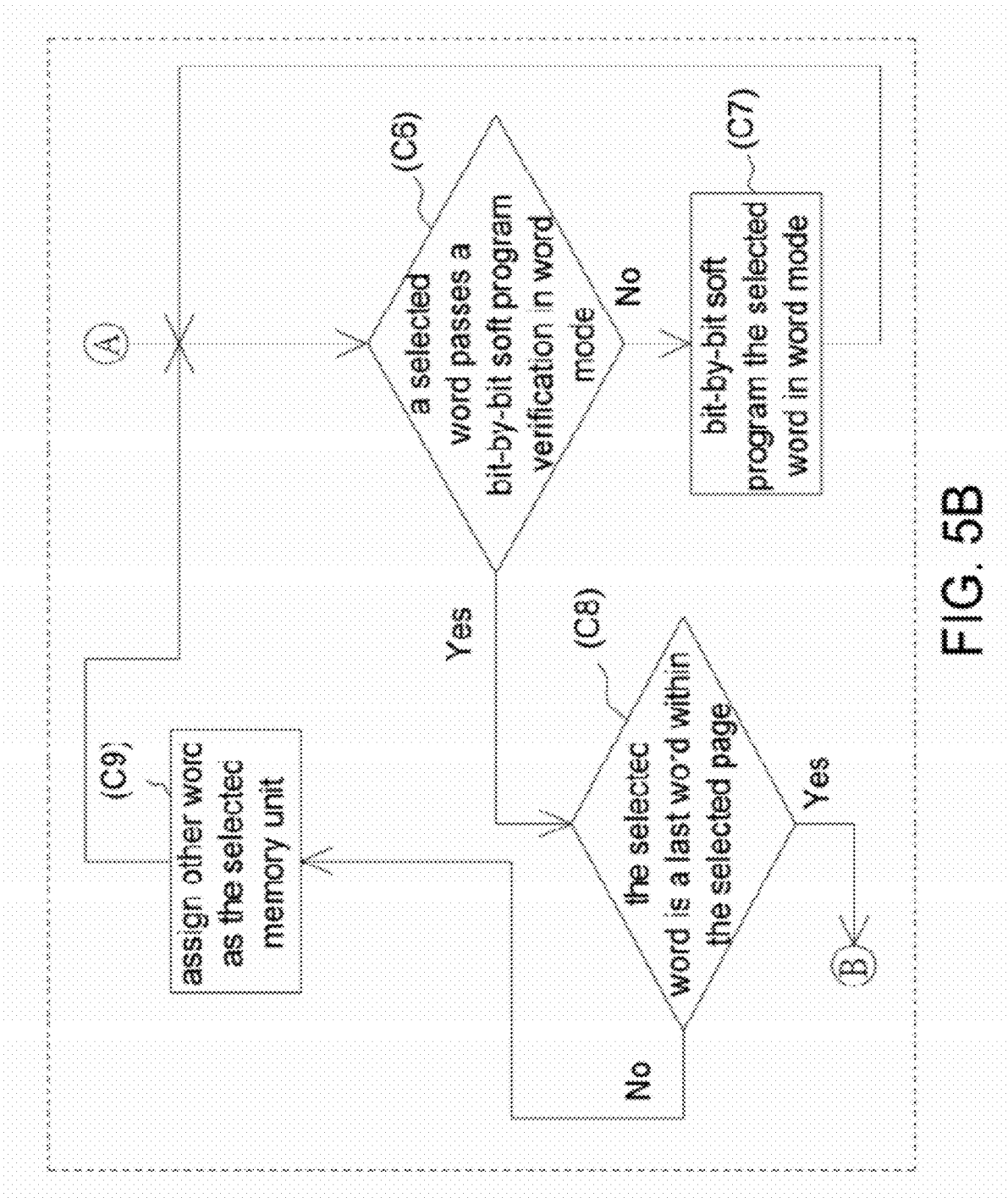

Referring to FIGS. 5A-5B, a detailed flow chart of an example of step (C) is shown in FIG. 2. In this example, step (C) includes sub-steps (C1)-(C8). In step (C1), whether a selected page among a number of pages within the memory array 1 passes a bit-by-bit soft program verification in page mode is determined; if so, the method proceeds to step (C2), in which whether the selected page is a last page is determined. When the selected page is not the last page within the memory array 1, step (C3) is performed, so that other page within the memory array 1 will be assigned as the selected page and the method is repeated from step (C1). When the selected page is the last page within the memory array 1, the method accordingly proceeds to an end.

After step (C1), when the selected page fails to pass the bit-by-bit soft program verification in page mode, step (C4) is performed, so that the selected page is accordingly bit-by-bit soft programmed in page mode. After step (C4), step (C5) is performed to determine whether step (C4) has been executed for more than a predetermined number of time. If not, the method is repeated from step (C1), so as to determine whether to switch from bit-by-bit soft program in page mode into bit-by-bit soft program in word mode. If not, it is determined to stay in bit-by-bit soft program in page mode and the method accordingly repeats step (C1).

After step (C5), when step (C4) has been executed for more than the predetermined number of times, it is determined to switch into bit-by-bit soft program in word mode and the method proceeds to step (C6) to determine whether a selected word among those words, which are segmented from the selected page, passes a bit-by-bit soft program verification in word mode. When the selected word fails to pass the bit-by-bit soft program verification in word mode, the method proceeds to step (C7), in which the selected word is bit-by-bit soft programmed in word mode, and then the method repeats step (C6). When the selected word passes the bit-by-bit soft program verification in word mode, the method proceeds to step (C8) to determine whether the selected word is a last word within the selected page. If not, the method proceeds to step (C9), in which other word among those words within the selected page are assigned as the selected memory unit and then repeats steps (C6). When the selected word is the last word, the method proceeds to step (C2).

Figure 6A:
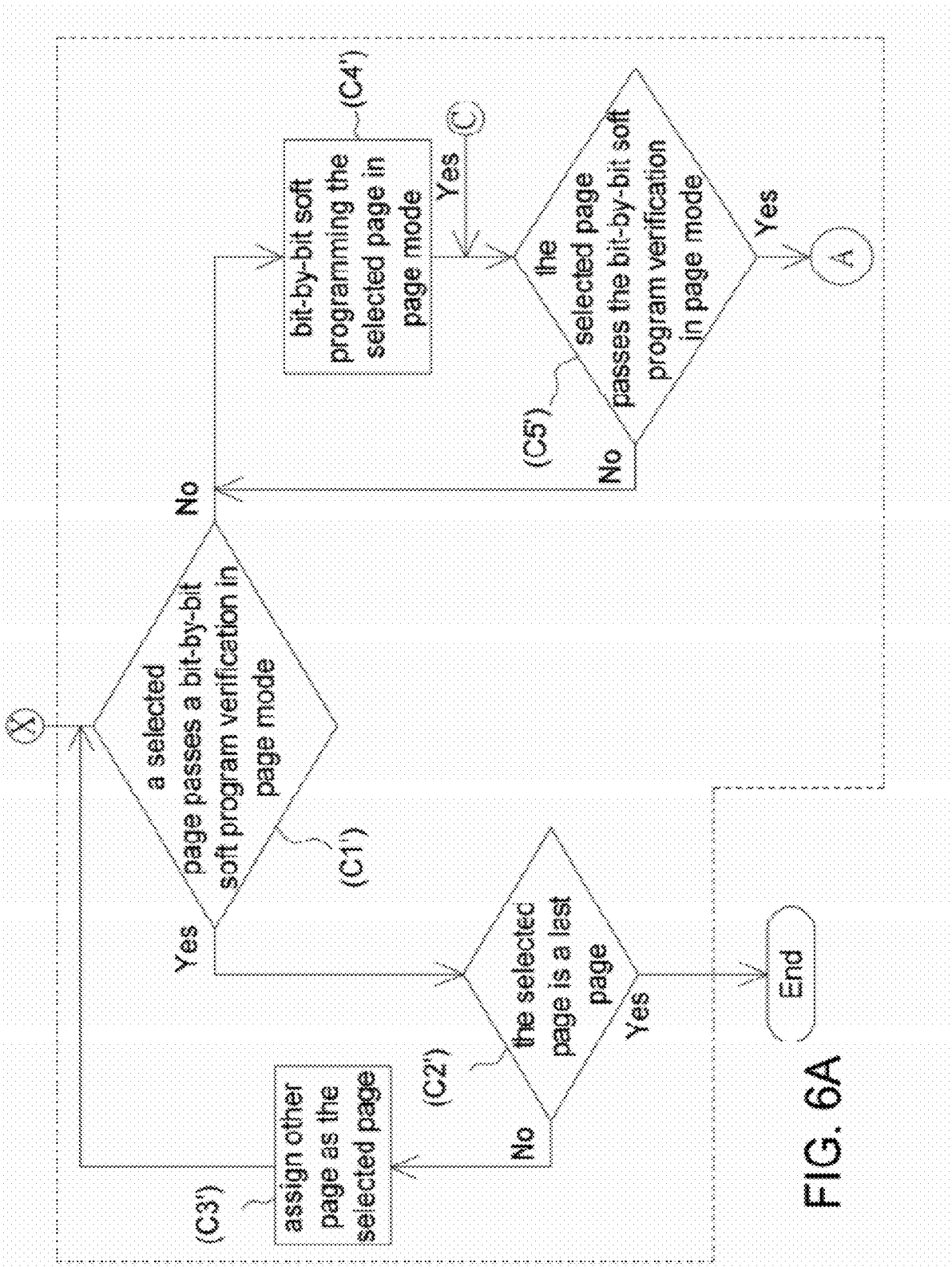
Figure 6B:
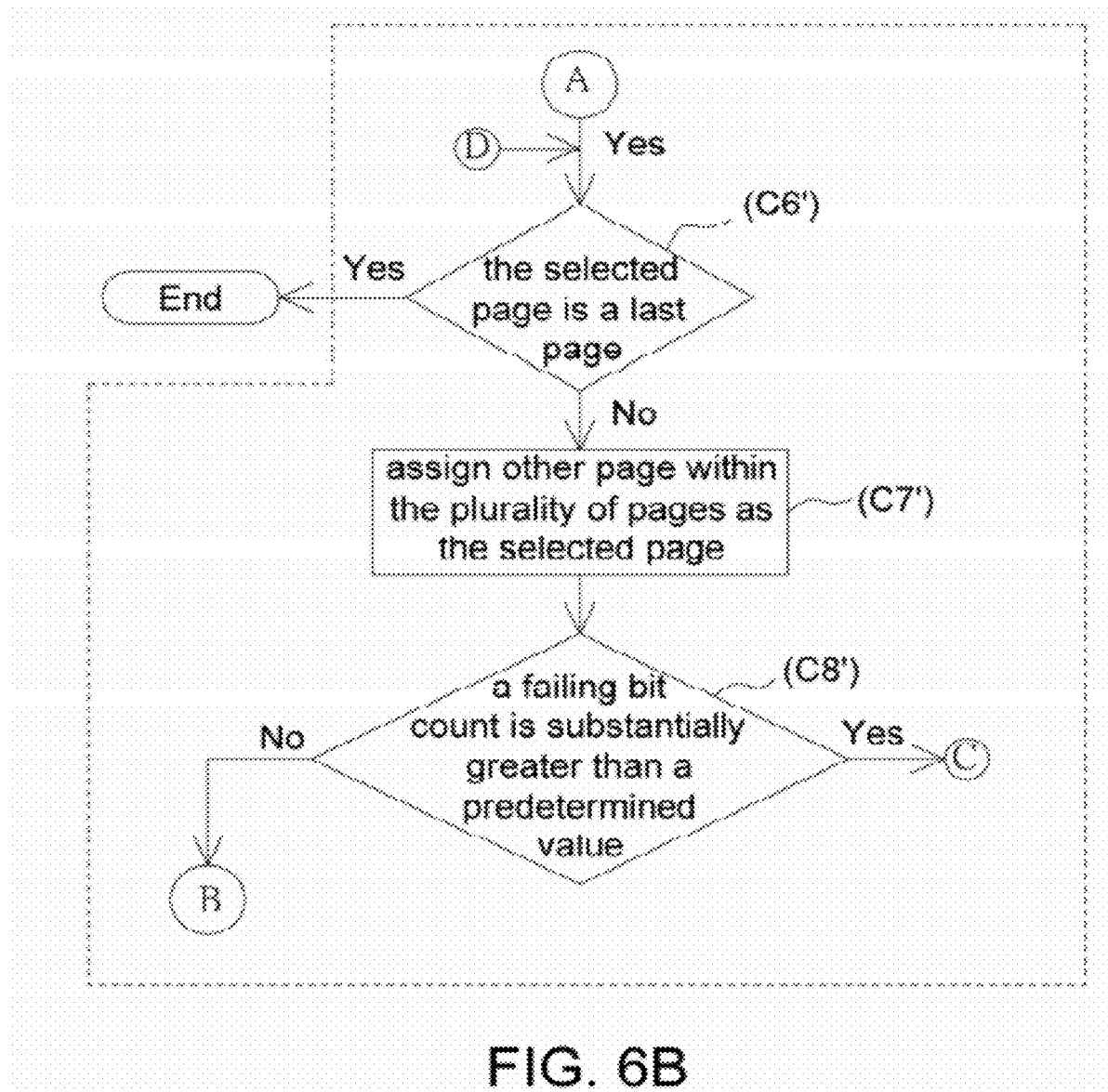
Figure 6C:
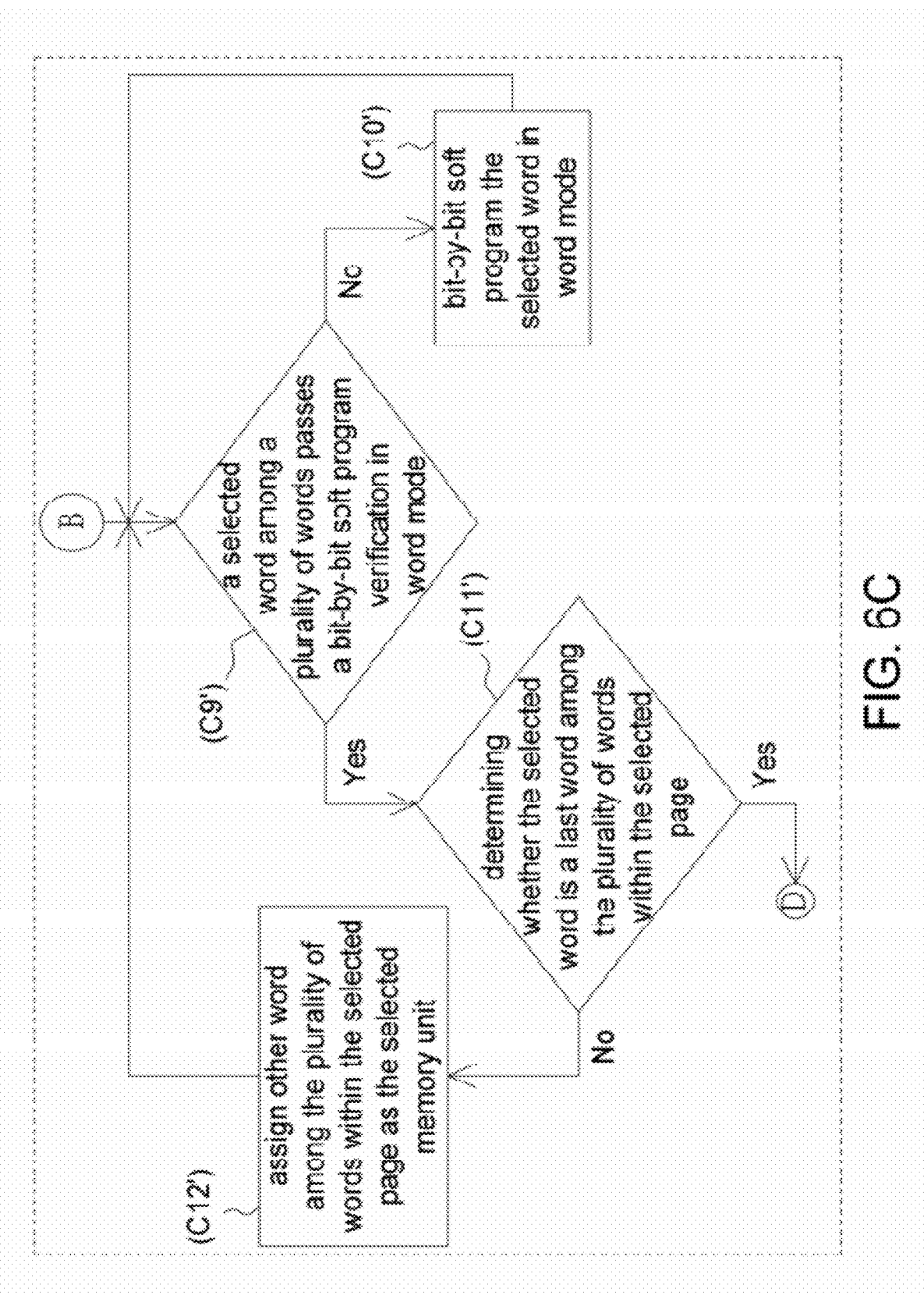

In other example, step (C) may include sub-steps as shown in FIGS. 6A-6C, wherein steps (C1')-(C4') shown in FIGS. 6A-6C are respectively the same as that shown in FIGS. 5A-5B and the corresponding description will be omitted for the sake of brevity. After step (C4'), step (C5') is performed to determine whether the selected page passes the bit-by-bit soft program verification in page mode. If not, step (C4') is repeated until the selected page passes the bit-by-bit soft program verification in page mode. If so, the method proceeds to step (C6'). In step (C6'), a determination as to whether the selected page is a last page is made. If so, the method proceeds to an end. If not, the method proceeds to step (C7') to assign other page, e.g., a next page of the previously selected page, within the plurality of pages as the selected page.

After step (C7'), step (C8') is performed to determine whether a failing bit count, indicating a number of bits that are over erased within the previously selected page selected in step (C1'), is substantially greater than a predetermined value. If so, it is determined that the previous selected page, i.e. the page selected in step (C1'), has a great number of bits (greater than the predetermined value) that are over erased before bit-by-bit soft program in page mode and the judgment is accordingly used for predicting whether the currently selected page also has a great number of bits that are over erased before bit-by-bit soft program in page mode.

When it is determined that the failing bit count is substantially greater than the predetermined value in step (C8'), it is predicted that the currently selected page do have a great number of bits that are over erased before bit-by-bit soft program in page mode, such that the method goes back to step (C5') for soft programming the currently selected page in page mode. Conversely, if the failing bit count is not substantially greater than the predetermined value, it is predicted that the currently selected page does not have a great number of bits that are over erased before bit-by-bit soft program in page ode. Therefore, the method proceeds to steps (C9')-(C12'), which are substantially the same as the steps (C6)-(C9) shown in FIGS. 5A-5B, to perform bit-by-bit soft program in word mode on each of the words within the currently selected page.

Figure 7A:
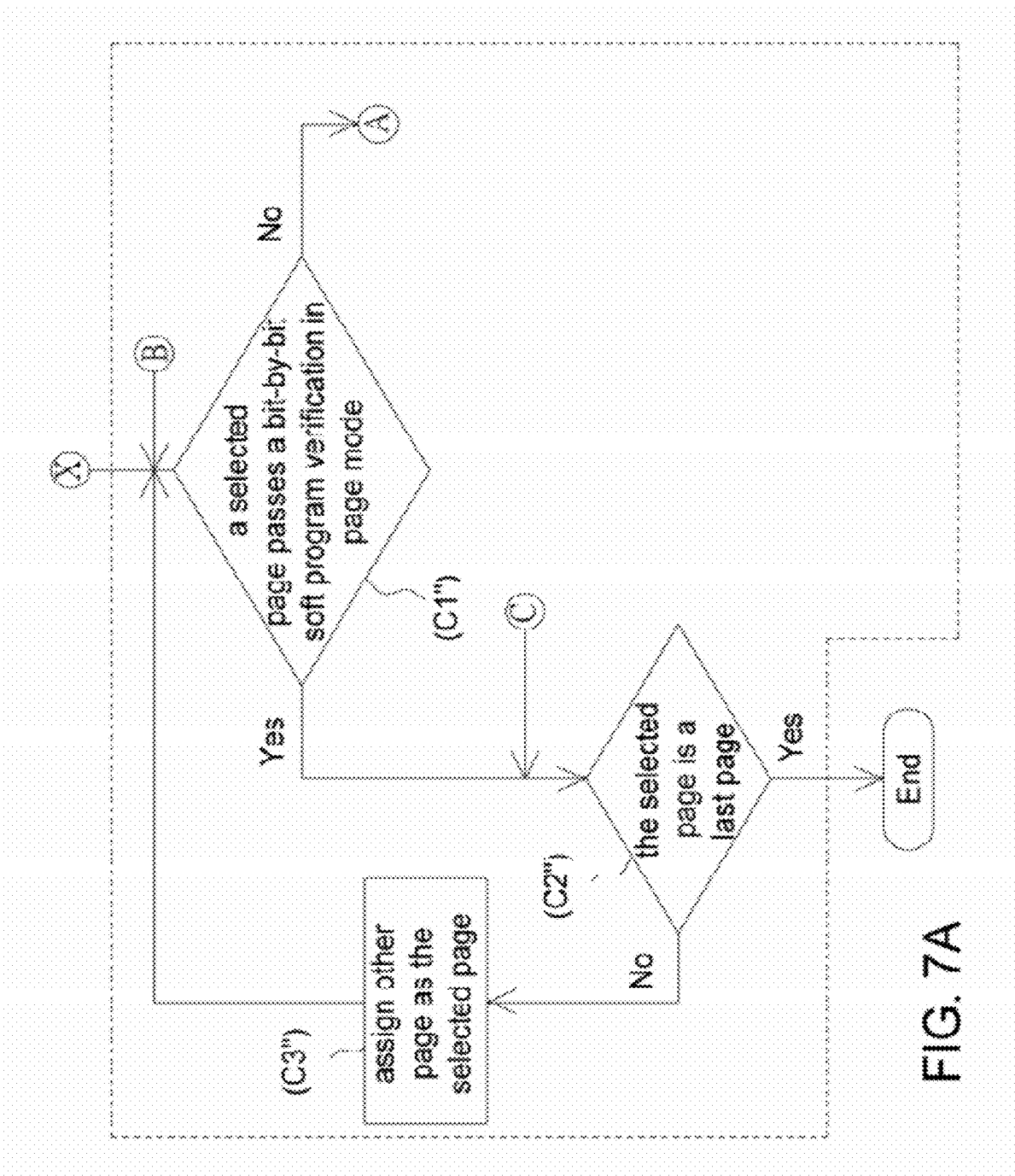
Figure 7B:
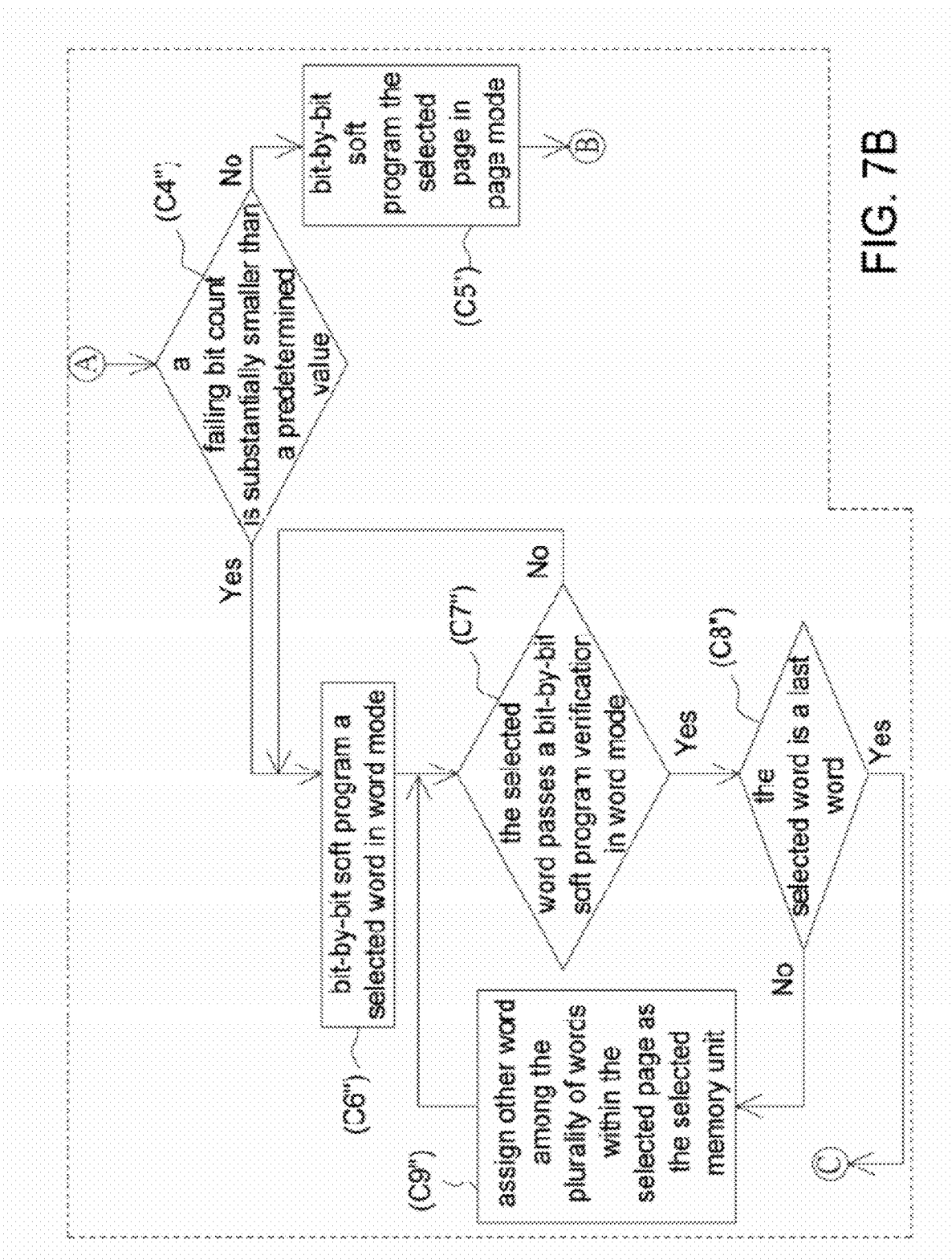

In still other example, step (C) may include sub-steps as shown in FIGS. 7A-7B, wherein steps (C1")-(C3") shown in FIGS. 7A-7B are respectively the same as that shown in FIGS. 5A-5B and will not be described for the sake of brevity. In step (C1"), if it is determined that the selected page fails to pass the bit-by-bit soft program verification in page mode, step (C4") is performed to determine whether a failing bit count, indicating a number of bits that are over erased within the selected page, is substantially smaller than a predetermined value. If not, step (C5") is performed to bit-by-bit soft program the selected page in page mode and repeating step (C1"). When the failing bit count is substantially smaller than the predetermined value, the method proceeds to step (C6") to bit-by-bit soft program a selected word among a number of words, which are segmented from the selected page, in word mode.

After step (C6"), the method proceeds to step (C7") to determine whether the selected word passes a bit-by-bit soft program verification in word mode. If not, the method goes back to step (C6"). If so, the method proceeds to step (C8") to determine whether the selected word is a last word within the selected page. If the selected word is the last word, the method returns to step (C2"); otherwise, step (C9") is performed to assign other word among those words within the selected page as the selected memory unit and step (C7") is then repeated.

Figure 8A:
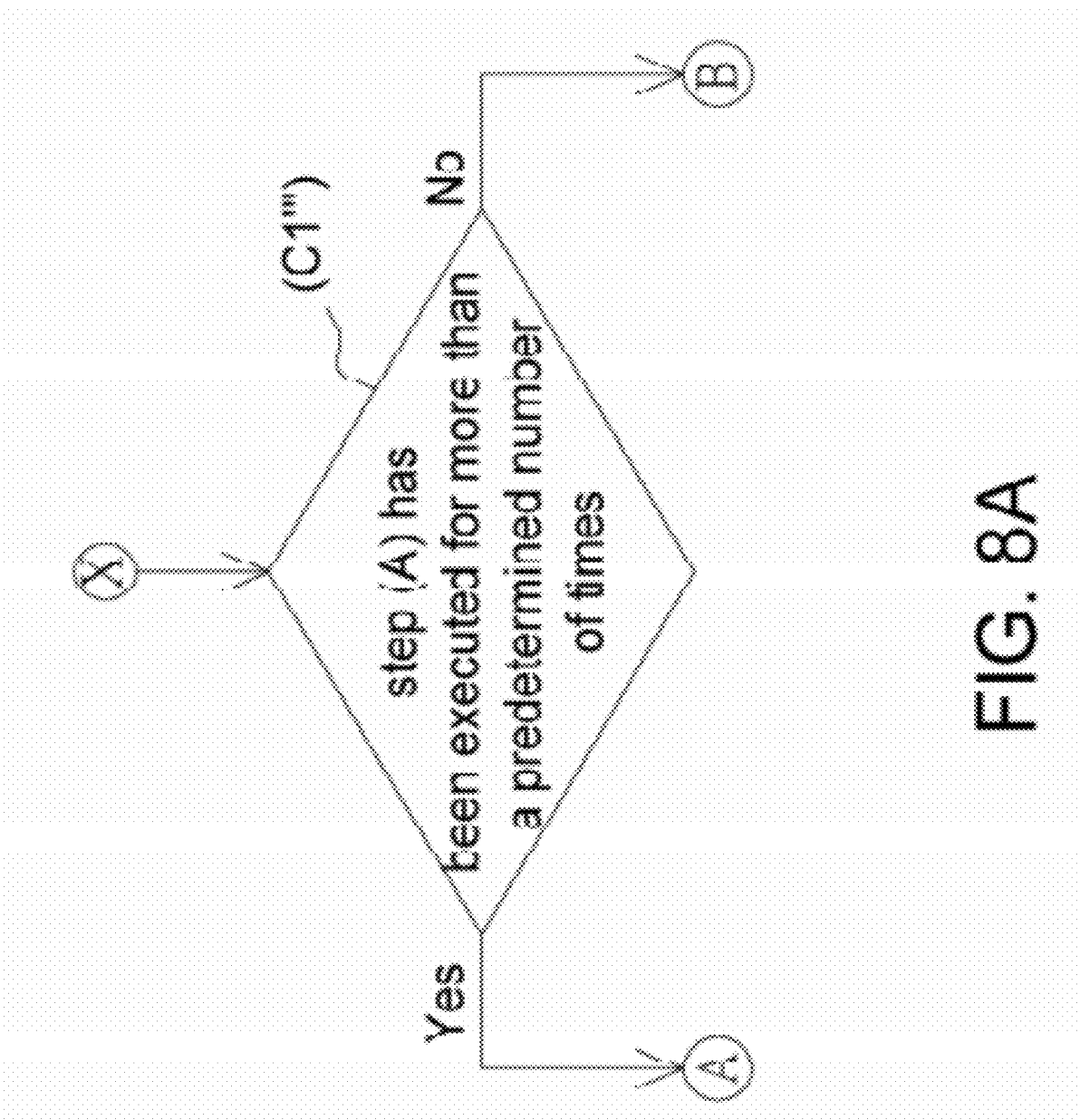
Figure 8B:
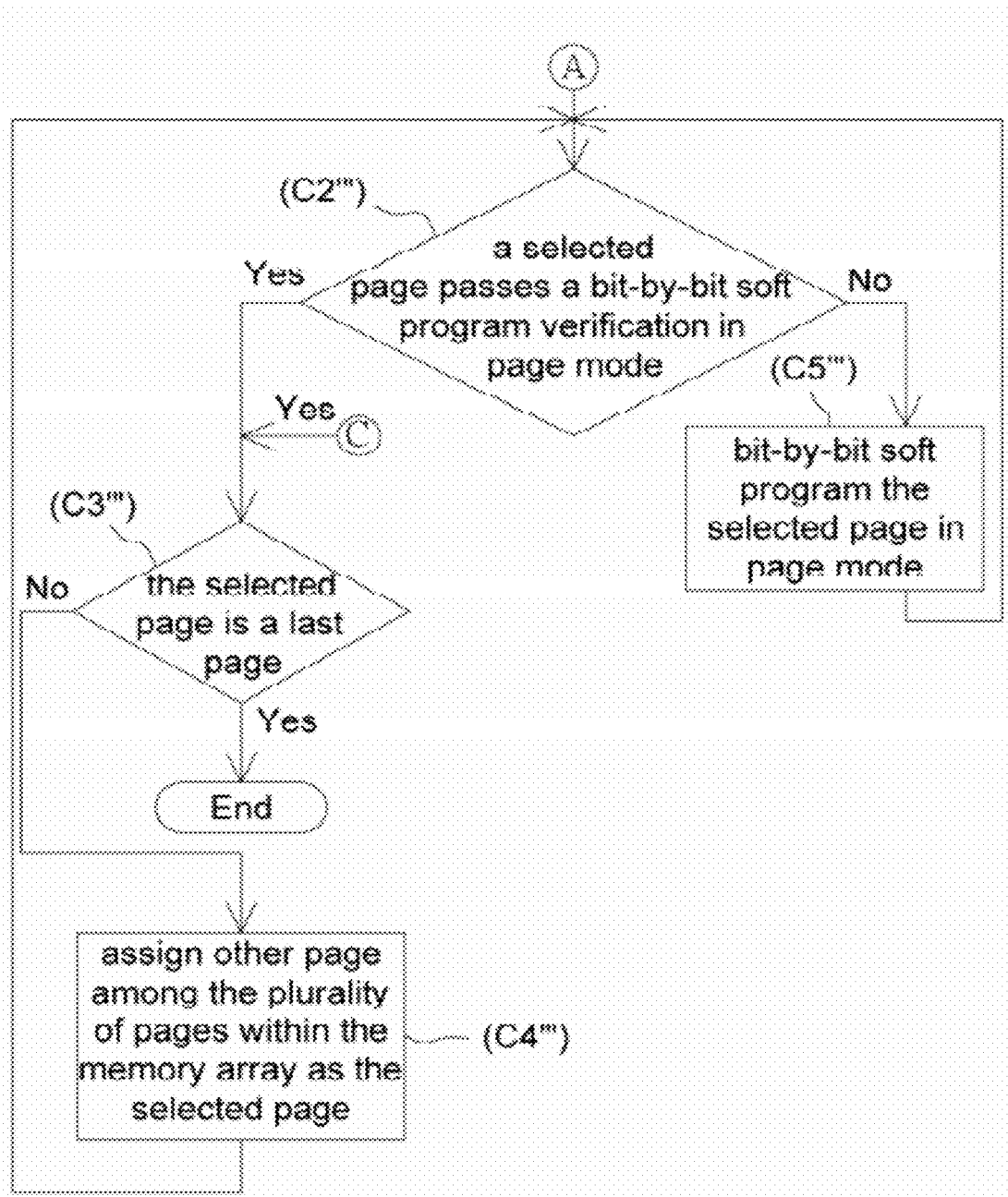
Figure 8C:
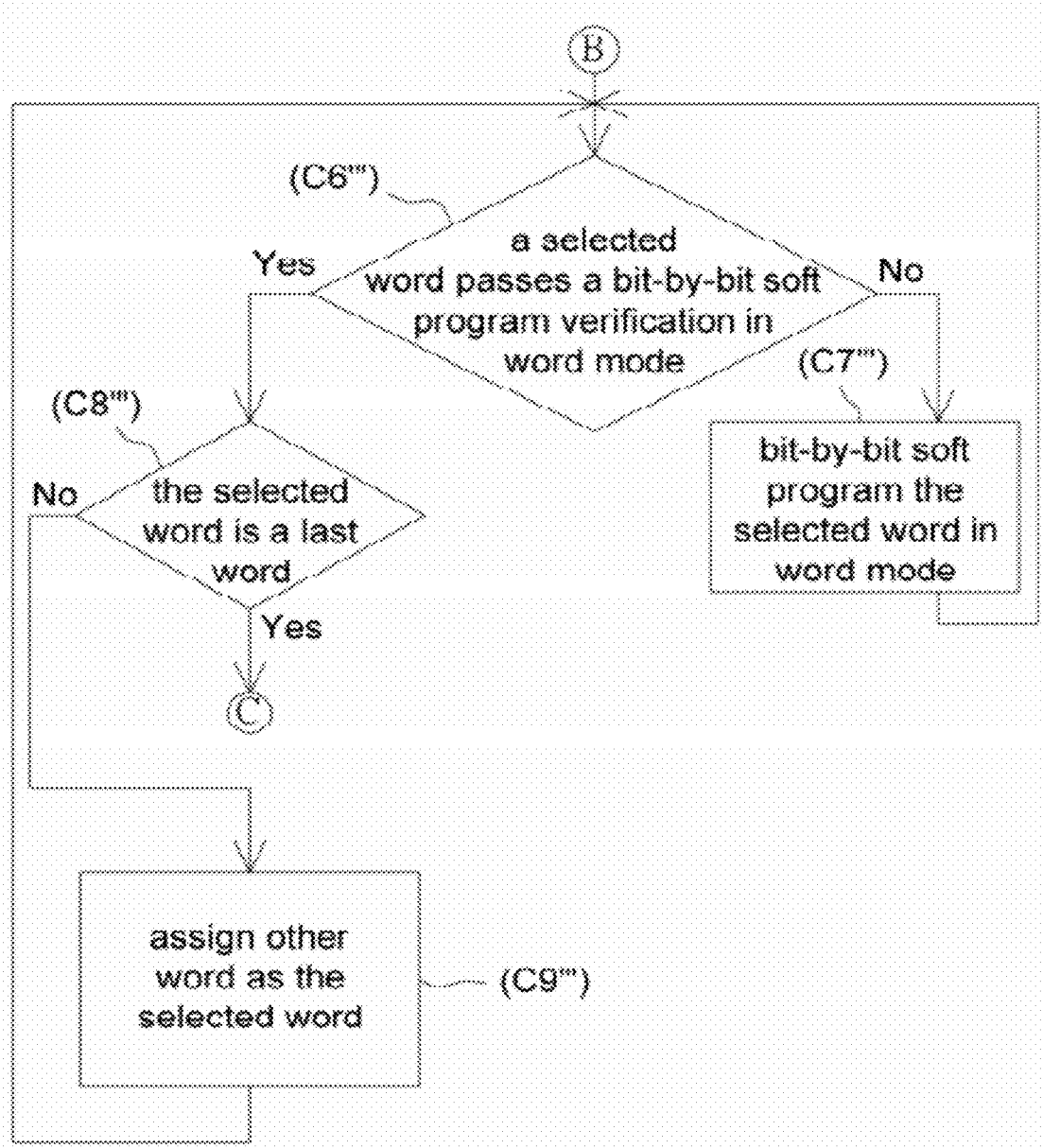

In still other example, step (C) may include sub-steps as shown in FIGS. 8A-8C. In an example, step (C) includes sub-steps (C1''')-(C9'''). In step (C1'''), executing times that step (A) is performed is obtained and whether step (A) has been executed for more than a predetermined number of times is accordingly determined. When step (A) has been executed for more than the predetermined number of times, steps (C2''') is performed to determine whether a selected page passes a bit-by-bit soft program verification in page mode. If not, step (C5''') is performed to bit-by-bit soft program the selected page in page mode, and then step (C2''') is repeated. If it is determined in step (C2''') that the selected page passes the bit-by-bit soft program verification in page mode, step (c3''') is then performed to determine whether the selected page is a last page among those pages within the memory array 1. When the selected page is not the last page, step (C4''') is performed to assign other page within the memory array 1 as the selected page and repeating step (C2"). When the selected page is the last page, the method proceeds to an end accordingly.

If it is determined in step (C1''') that step (A) has not been executed for more than the predetermined number of times, step (C6''')-(C9''') are performed to execute bit-by-bit soft program operation on each of the words within the selected page, wherein steps (C6''')-(C9''') shown in FIGS. 8A-8C are respectively the same as steps (C9')-(C12') shown in FIGS. 6A-6C and the corresponding description will be omitted for the sake of brevity.

Figure 9:
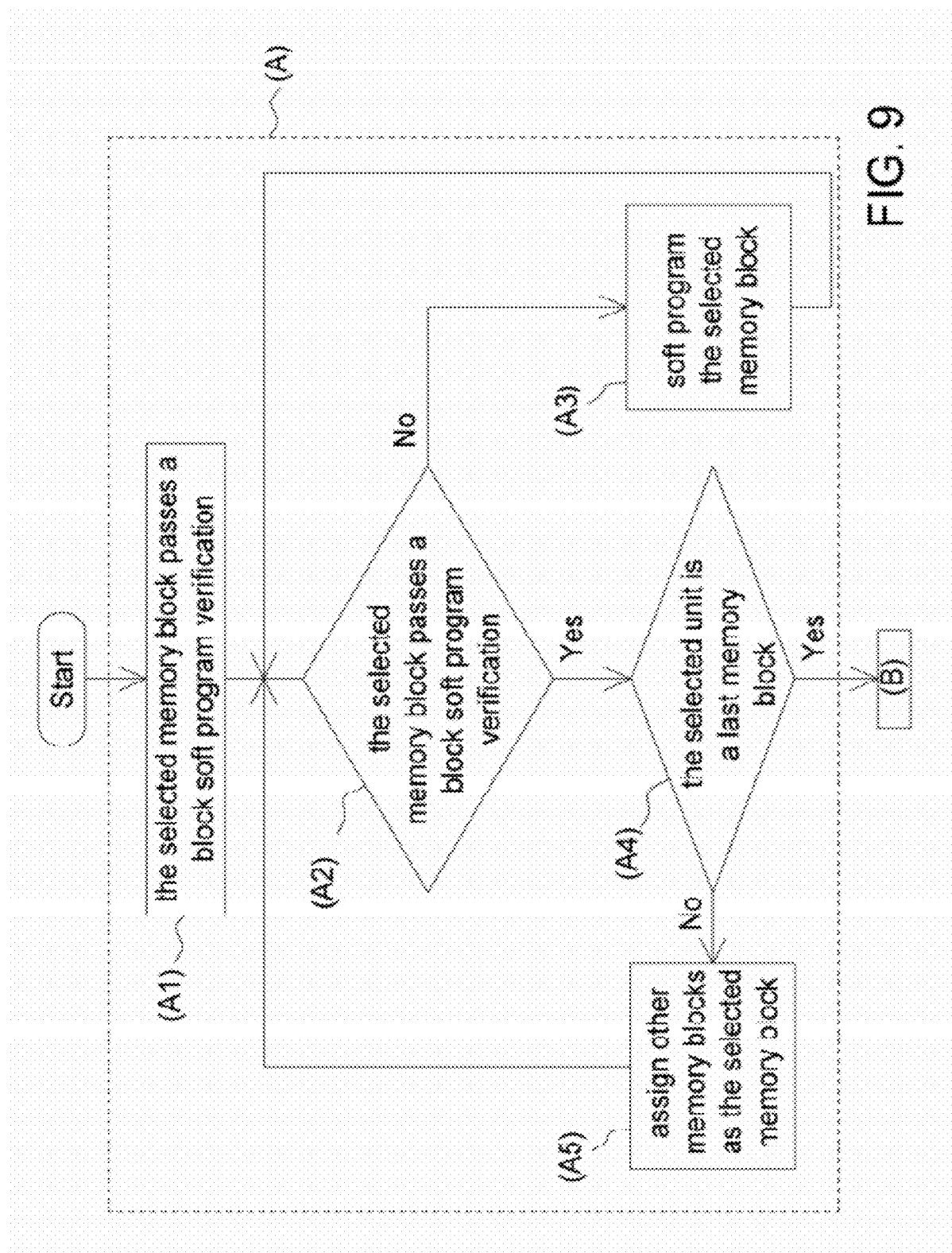
FIG. 9 shows detailed flow chart of an example of step (A) shown in FIG. 2.

Further, step (A) may further includes sub-steps (A1)-(A5), as shown in FIG. 9. Firstly as shown in step (A1), a selected memory block among those memory blocks is selected. Next, step (A2) is performed to determine whether the selected memory block passes a block soft program verification. If not, step (A3) is performed to soft program the selected memory block and step (A2) is repeated. If so, step (A4) is performed to determine whether the selected unit is the last memory block within the memory array 1. If so, the method proceeds to step (B); otherwise, step (A5) is performed to assign other memory blocks within the memory array 1 as the selected memory block and repeating steps (A2).

As described above, the above embodiment of the soft program method including steps (A), (B), and (C) has been illustrated by different examples. In other embodiments, a soft program method including step (C) after step (A) without step (B), or including step (A) and (C) with step (B) being performed selectively according to other criteria or with step (B) modified or with step (B) replaced, or including step (C), can also be achievable. In such case, various kinds of verification or judging criteria, e.g., the failing bit count or the execution times of block soft program, as exemplified in the above description, may be employed for determining whether to proceed to step (C) from step (A) or from other situation.

The above embodiments provide a soft program method applied in flash memory for recovering memory cells, which are over erased in an erase operation, of the flash array. The soft program method according to one embodiment applies soft program operations in block-by-block scale (i.e. soft program operation by column), in unit-by-unit (with size smaller than memory block) scale, and in bit-by-bit scale. The soft program method according to the embodiment further includes a number of different smart soft program manners for realizing soft program operation in bit-by-bit scale. Thus, in comparison to the conventional soft program method, the soft program method according to the embodiment is advantageously capable of reducing time and cost required by soft program operation.

Though only the situation that the third bias voltage has a level higher than the second bias voltage, which has a level higher than the first bias voltage has been disclosed in this embodiment, the first to the third bias voltages are not limited thereto. In other embodiment, the first to the third bias voltages may substantially correspond with a same voltage level, or in other cases, the first to the third bias voltages satisfy any of the following conditions: $Vb1=Vb2<Vb3$; $Vb1<Vb2=Vb3$.

The method as illustrated above can also be embodied as computer or processor readable code on a computer or processor readable medium. The readable medium is any data storage device that can store data which can be thereafter be read by a computer system or processor-based controller, a microcontroller. Examples of the computer readable medium include read-only memory (ROM), random-access memory (RAM), CD-ROMs, magnetic tape, and optical data storage devices. Further, the readable medium also includes the programmable processor or microcontroller with built-in memory programmed with instructions to perform the method according to the examples disclosed.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A soft program method for recovering memory cells, which are over erased in an erase operation, of a memory array including a plurality of memory blocks, the method comprising:
   (A) soft programming the plurality of memory blocks with a first bias voltage, wherein each of the memory blocks is segmented into a plurality of memory units;
   (B1) soft programming a selected memory unit within a selected memory block with a second bias voltage;
   (B2) determining whether a judging criterion corresponding to the selected memory unit is met; if not, repeating from step (B1);
   (B3) when the judging criterion is met, determining whether the selected unit is a last memory unit within the selected memory block;
   (B4) when the selected unit is not the last memory unit, assigning other memory unit as the selected memory unit and repeating from step (B1); and
   (C) when the selected memory unit is the last memory unit, bit-by-bit soft programming the memory array with a third bias voltage.

2. The method according to claim 1, wherein step (A) further comprises:
   (A1) selecting a selected memory block among the plurality of memory blocks;
   (A2) determining whether the selected memory block passes a block soft program verification;
   (A3) when the selected memory block fails to pass the block soft program verification, soft programming the selected memory block and then repeating from step (A2); and
   (A4) when the selected memory block passes the block soft program verification, determining whether the selected unit is a last memory block within the memory array; and
   (A5) when the selected unit is not the last memory block, assigning other memory blocks among the plurality of memory blocks as the selected memory block and repeating from step (A2).

3. The method according to claim 1, wherein the step (B2) comprises:
   (B2a) obtaining executing times that step (B1) is performed; and
   (B2b) determining whether step (B1) has been executed for more than a predetermined number of times, wherein if so, it is determined that the judging criterion is met; otherwise, it is determined that the judging criterion is not met.

4. The method according to claim 1, wherein step (B2) comprises:
   (B2a') obtaining a failing bit count indicating a number of bits that are over erased within the selected memory unit; and
   (B2b') determining whether the failing bit count is not substantially smaller than a predetermined value corresponding to a previously obtained failing bit count obtained in a bit-by-bit soft program verification, wherein if not, it is determined that the judging criterion is met; wherein when the failing bit count is substantially smaller than the predetermined value, it is determined that the judging criterion is not met.

5. The method according to claim 1, wherein the memory array is configured with M word lines and N bit lines and each of the memory blocks comprises memory cells accessed via the M word lines and a part of the N bit lines, wherein each of the memory units within a memory block comprises memory cells accessed via a part of the M word lines and the part of the N bit lines and M and N are natural number greater than 1.

6. The method according to claim 1, wherein the step (C) comprises:
   (C1) determining whether a selected page among a plurality of pages, which are segmented from the memory array, passes a bit-by-bit soft program verification in page mode;
   (C2) when the selected page passes the bit-by-bit soft program verification in page mode, determining whether the selected page is a last page; and
   (C3) when the selected page is not the last page, assigning other page within the plurality of pages as the selected page and repeating from step (C1).

7. The method according to claim 6, wherein the step (C) further comprises:
   (C4) when the selected page fails to pass the bit-by-bit soft program verification in page mode, bit-by-bit soft programming the selected page in page mode; and
   (C5) after step (C4), determining whether step (C4) has been executed for more than a predetermined number of times; if not, repeating from step (C1).

8. The method according to claim 7, wherein step (C) further comprises:
   (C6) when step (C4) has been executed for more than the predetermined number of times, determining whether a selected word among a plurality of words, which are segmented from the selected page, passes a bit-by-bit soft program verification in word mode;
   (C7) when the selected word fails to pass the bit-by-bit soft program verification in word mode, bit-by-bit soft programming the selected word in word mode, and repeating from step (C6);
   (C8) when the selected word passes the bit-by-bit soft program verification in word mode, determining whether the selected word is a last word among the plurality of words within the selected page;
   (C9) when the selected word is not the last word, assigning other word among the plurality of words within the selected page as the selected memory unit and repeating from step (C6); and
   (C10) when the selected word is the last word, returning to step (C2).

9. The method according to claim 6, wherein step (C) further comprises:
   (C4) when the selected page fails to pass the bit-by-bit soft program verification in page mode, bit-by-bit soft programming the selected page in page mode;
   (C5) after step (C4), determining whether the selected page passes the bit-by-bit soft program verification in page mode; if not, repeating from step (C4); and
   (C6) after step (C5), when the selected page passes the bit-by-bit soft program verification in page mode, determining whether the selected page is a last page;
   (C7) when the selected page is not the last page, assigning other page within the plurality of pages as the selected page; and
   (C8) after step (C7), determining whether a failing bit count, indicating a number of bits that are over erased within the previously selected page selected in step (C1), is substantially greater than a predetermined value; if so, repeating from step (C4).

10. The method according to claim 9, wherein step (C) further comprises:
   (C9) when the failing bit count is substantially greater than a predetermined value, determining whether a selected word among a plurality of words, which are segmented from the selected page, passes a bit-by-bit soft program verification in word mode;
   (10) when the selected word fails to pass the bit-by-bit soft program verification in word mode, bit-by-bit soft programming the selected word in word mode, and repeating from step (C9);
   (C11) when the selected word passes the bit-by-bit soft program verification in word mode, determining whether the selected word is a last word among the plurality of words within the selected page;
   (C12) when the selected word is not the last word, assigning other word among the plurality of words within the selected page as the selected memory unit and repeating from step (C9); and
   (C13) when the selected word is the last word, returning to step (C6).

11. The method according to claim 6, wherein step (C) further comprises:
   (C4) when the selected page fails to pass the bit-by-bit soft program verification in page mode, determining whether a failing bit count, indicating a number of bits that are over erased within the selected page, is substantially smaller than a predetermined value;
   (C5) when the failing bit count is not substantially smaller than the predetermined value, bit-by-bit soft programming the selected page in page mode and repeating from step (C1); and
   (C6) when the failing bit count is substantially smaller than the predetermined value, bit-by-bit soft programming a selected word among a plurality of words, which are segmented from the selected page, in word mode.

12. The method according to claim 11, wherein step (C) further comprises:
   (C7) after step (C6), determining whether the selected word passes a bit-by-bit soft program verification in word mode; if not, repeating from step (C6);
   (C8) when the selected word passes the bit-by-bit soft program verification in word mode, determining whether the selected word is a last word among the plurality of words within the selected page;
   (C9) when the selected word is not the last word, assigning other word among the plurality of words within the selected page as the selected memory unit and repeating from step (C7); and
   (C10) when the selected word is the last word, returning to step (C2).

13. The method according to claim 1, wherein step (C) further comprises:
   (C1) determining whether step (A) has been executed for more than a predetermined number of times;
   (C2) when step (A) has been executed for more than the predetermined number of times, determining whether a selected page among a plurality of pages, which are segmented from the memory array, passes a bit-by-bit soft program verification in page mode;
   (C3) when the selected page passes the bit-by-bit soft program verification in page mode, determining whether the selected page is a last page among the plurality of pages within the memory array;
   (C4) when the selected page is not the last page, assigning other page among the plurality of pages within the memory array as the selected page and repeating from step (C2); and
   (C5) when the selected page fails to pass the bit-by-bit soft program verification in page mode, bit-by-bit soft programming the selected page in page mode, and then repeating from step (C2).

14. The method according to claim 13, wherein step (C) further comprises:
   (C6) when step (A) has not been executed for more than the predetermined number of times, determining whether a selected word among a plurality of words, which are segmented from the selected page, passes a bit-by-bit soft program verification in word mode;
   (C7) when the selected word fails to pass the bit-by-bit soft program verification in word mode, bit-by-bit soft programming the selected word in word mode, and then repeating from step (C6);
   (C8) when the selected word passes the bit-by-bit soft program verification in word mode, determining whether the selected word is a last word among the plurality of words within the selected page;
   (C9) when the selected word is not the last word, assigning other word among the plurality of words within the selected page as the selected word and repeating from step (C6); and
   (C10) when the selected word is the last word, repeating from step (C3).

15. The method according to claim 1, wherein the third bias voltage has a level higher than that of the second bias voltage.

16. The method according to claim 13, wherein the second bias voltage has a level higher than that of the first bias voltage.

17. A computer readable medium having instructions therein for executing a soft-program method for recovering memory cells, which are over-erased in an erase operation, of a memory array, the memory array comprising a plurality of memory blocks, said instructions, when executed, perform said method including the steps of:
   (A) soft programming the plurality of memory blocks with a first bias voltage, wherein each of the memory blocks can be segmented into a plurality of memory units;
   (B1) soft programming a selected memory unit within a selected memory block with a second bias voltage;
   (B2) determining whether a judging criterion corresponding to the selected memory unit is met; if not, repeating from step (B1);
   (B3) when the judging criterion is met, determining whether the selected unit is a last memory unit among the selected memory block;
   (B4) when the selected unit is not the last memory unit, assigning other memory unit as the selected memory unit and repeating from step (B1); and
   (C) when the selected unit is the last memory unit, bit-by-bit soft programming the memory array with a third bias voltage.

* * * * *